US008771929B2

(12) United States Patent
Guillorn et al.

(10) Patent No.: US 8,771,929 B2
(45) Date of Patent: Jul. 8, 2014

(54) TONE INVERSION OF SELF-ASSEMBLED SELF-ALIGNED STRUCTURES

(75) Inventors: Michael A. Guillorn, Yorktown Heights, NY (US); Steven J. Holmes, Guilderland, NY (US); Chi-Chun Liu, San Jose, CA (US); Hiroyuki Miyazoe, White Plains, NY (US); Hsinyu Tsai, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 13/587,088

(22) Filed: Aug. 16, 2012

(65) Prior Publication Data

US 2014/0148012 A1    May 29, 2014

(51) Int. Cl.
*G03F 7/26*    (2006.01)

(52) U.S. Cl.
USPC ......................................................... 430/323

(58) Field of Classification Search
CPC ..................... H01L 21/3239; H01L 21/31144; G03F 7/0002
USPC ......................................... 430/322, 323, 330
See application file for complete search history.

(56) References Cited

U.S. PATENT DOCUMENTS

| 8,114,306 | B2 | 2/2012 | Cheng et al. |
| 8,133,534 | B2 | 3/2012 | Stoykovich et al. |
| 8,173,034 | B2 | 5/2012 | Millward et al. |

OTHER PUBLICATIONS

Yamaguchi, T. et al., "Two-Dimensional Arrangement of Vertically Oriented Cylindrical Domains of Diblock Copolymers using Graphoepitaxy with Artificial Guiding Pattern Layout" 2007 Digest of Papers, Microprocesses and Nanotechnology (Nov. 5-8, 2007) pp. 434-435.
Geis, M.W. et al., "Crystalline Silicon on Insulators by Graphoepitaxy" IEEE International Electron Devices Meeting (Dec. 3-5, 1979) pp. 210-212, vol. 25.
Cheng, J.Y. et al., "Simple and Versatile Methods to Integrate Directed Self-Assembly with Optical Lithography Using a Polarity-Switched Photoresist" ACS Nano (Aug. 24, 2010) pp. 4815-4823, vol. 4, No. 8.
Bencher, C. et al., "Self-Assembly Patterning for sub-15nm Half-Pitch: A Transition from Lab to Fab" Proceedings of SPIE (Apr. 1, 2011) pp. 1-9, vol. 7970.
US 8,123,960, 02/2012, Millward et al. (withdrawn)
US 8,123,962, 02/2012, Millward et al. (withdrawn)

*Primary Examiner* — Brittany Raymond
(74) *Attorney, Agent, or Firm* — Scully, Scott, Murphy & Presser, P.C.; Louis J. Percello, Esq.

(57) ABSTRACT

A stack of an organic planarization layer (OPL) and a template layer is provided over a substrate. The template layer is patterned to induce self-assembly of a copolymer layer to be subsequently deposited. A copolymer layer is deposited and annealed to form phase-separated copolymer blocks. An original self-assembly pattern is formed by removal of a second phase separated polymer relative to a first phase separated polymer. The original pattern is transferred into the OPL by an anisotropic etch, and the first phase separated polymer and the template layer are removed. A spin-on dielectric (SOD) material layer is deposited over the patterned OPL that includes the original pattern to form SOD portions that fill trenches within the patterned OPL. The patterned OPL is removed selective to the SOD portions, which include a complementary pattern. The complementary pattern of the SOD portions is transferred into underlying layers by an anisotropic etch.

25 Claims, 16 Drawing Sheets

TONE INVERSION OF SELF-ASSEMBLED SELF-ALIGNED STRUCTURES

STATEMENT REGARDING FEDERALLY SPONSORED RESEARCH OR DEVELOPMENT

This invention was made with Government support under Contract No. FA8650-10-C-7038 awarded by Defense Advanced Research Projects Agency (DARPA). The Government has certain rights in this invention.

BACKGROUND

The present disclosure relates generally to a method of forming nanoscale structures, and more particularly to a method of inverting tones of two-dimensional self-assembled sublithographic nanoscale structures, and structures for implementing the same.

As integrated circuit densities have scaled, the use of grating based patterning techniques and unidirectional design has become an integral part of pattern formation technology. Grating fabrication can be effected using a variety of techniques including direct self-assembly, sidewall image transfer, pitch split lithography, extreme ultraviolet lithography, electron beam lithography, and interference lithography.

The grating pattern needs to be customized in order to form a circuit pattern. The ability to register customizing shapes to the grating pattern imposes a limitation on the spatial frequency (pitch) of the grating structure.

Directed self-assembly is a technique for forming a sublithographic line/space pattern utilizing the phase separation of a block copolymer thin film. The resolution and the critical dimension (CD) of the pattern are controlled by the composition of the copolymer. The methods of aligning the phase separated copolymers include chemical epitaxy and graphoepitaxy. The advantages of direct self-assembly include a high resolution of features at dimensions less than 10 nm, compatibility with existing lithography techniques, and the ability for frequency multiplication and space subdivision.

Directed self-assembly, however, requires a template layer to induce the alignment of phase separated polymers to the shape of the template layer. Thus, a pattern that can be formed by direct self-assembly alone is limited by requirements on the pattern of the template layer.

SUMMARY

A stack of an organic planarization layer (OPL) and a template layer is provided over a substrate. The template layer is patterned to induce self-assembly of a copolymer layer to be subsequently deposited. A copolymer layer is deposited and annealed to form phase-separated copolymer blocks. An original self-assembly pattern is formed by removal of a second phase separated polymer relative to a first phase separated polymer. The original pattern is transferred into the OPL by an anisotropic etch, and the first phase separated polymer and the template layer are removed. A spin-on dielectric (SOD) material layer is deposited over the patterned OPL that includes the original pattern to form SOD portions that fill trenches within the patterned OPL. The patterned OPL is removed selective to the SOD portions, which include a complementary pattern. The complementary pattern of the SOD portions is transferred into underlying layers by an anisotropic etch.

According to an aspect of the present disclosure, a method of forming a patterned structure is provided. An organic planarization layer (OPL) is formed over a substrate. A self-aligned assembly of first polymer blocks including a first polymeric block component and second polymer blocks including a second polymeric block component is then formed on the OPL. A first pattern of protruding structures including the first polymer blocks is formed by removing the second polymer blocks selective to the first polymer blocks. The OPL is patterned employing at least the first polymer blocks as an etch mask, wherein trenches are formed within the patterned OPL. Spin-on dielectric (SOD) portions are formed by filling the trenches with an SOD material. A second pattern of protruding structures including the SOD portions is formed by removing the patterned OPL selective to the SOD portions.

According to another aspect of the present disclosure, a structure including a pattern-containing layer is provided. The pattern-containing layer is located over a substrate and complementarily filled with a matrix and at least one nested structure. The matrix includes a contiguous patterned organic planarization layer (OPL) that embeds each of the at least one nested structure therein. One of the at least one nested structure includes a spin-on dielectric (SOD) portion having outer vertical surfaces that contact vertical surfaces of the contiguous patterned OPL, and an OPL portion having outer surfaces that contact inner vertical surfaces of the SOD portion.

DETAILED DESCRIPTION

Figure 1A:
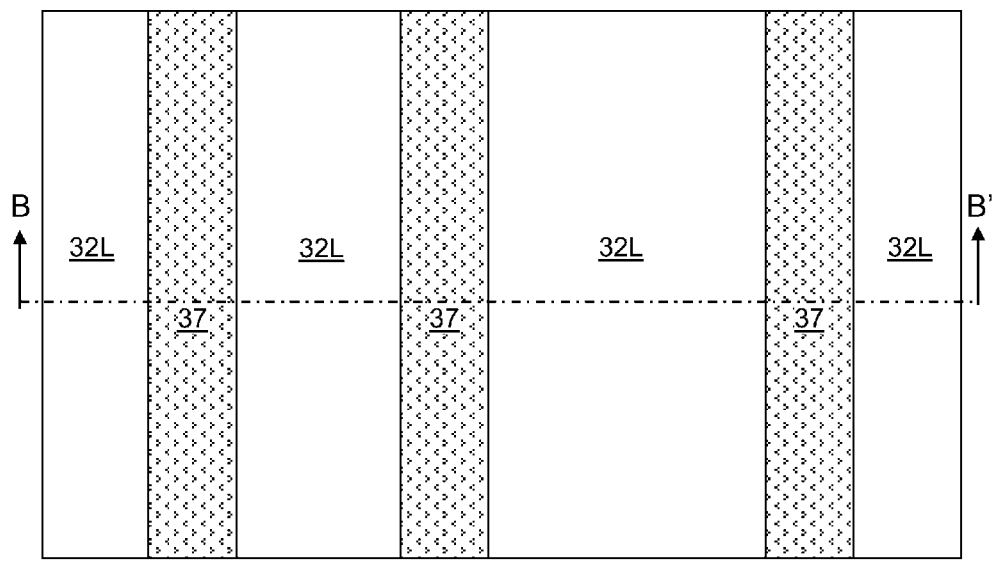
FIG. 1A is a top-down view of a first exemplary patterned structure after formation of an organic planarization layer (OPL), a hard mask layer, a buffer polymer layer, and a patterned template layer according to an embodiment of the present disclosure.

As stated above, the present disclosure relates to a method of inverting tones of two-dimensional self-assembled sublithographic nanoscale structures, and structures for implementing the same, which are now described in detail with accompanying figures. It is noted that like and corresponding elements are referred to by like reference numerals.

Figure 1B:
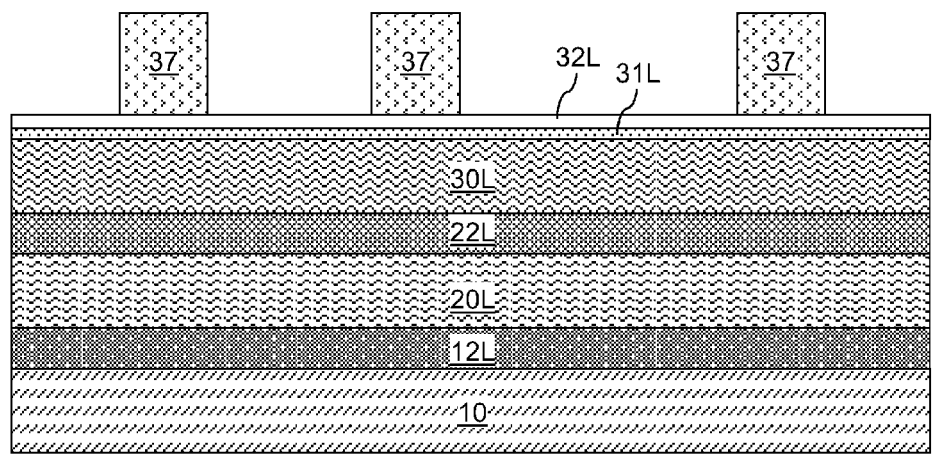
FIG. 1B is a vertical cross-sectional view of the first exemplary patterned structure along the vertical plane B-B' of FIG. 1A.
Figure 1C:
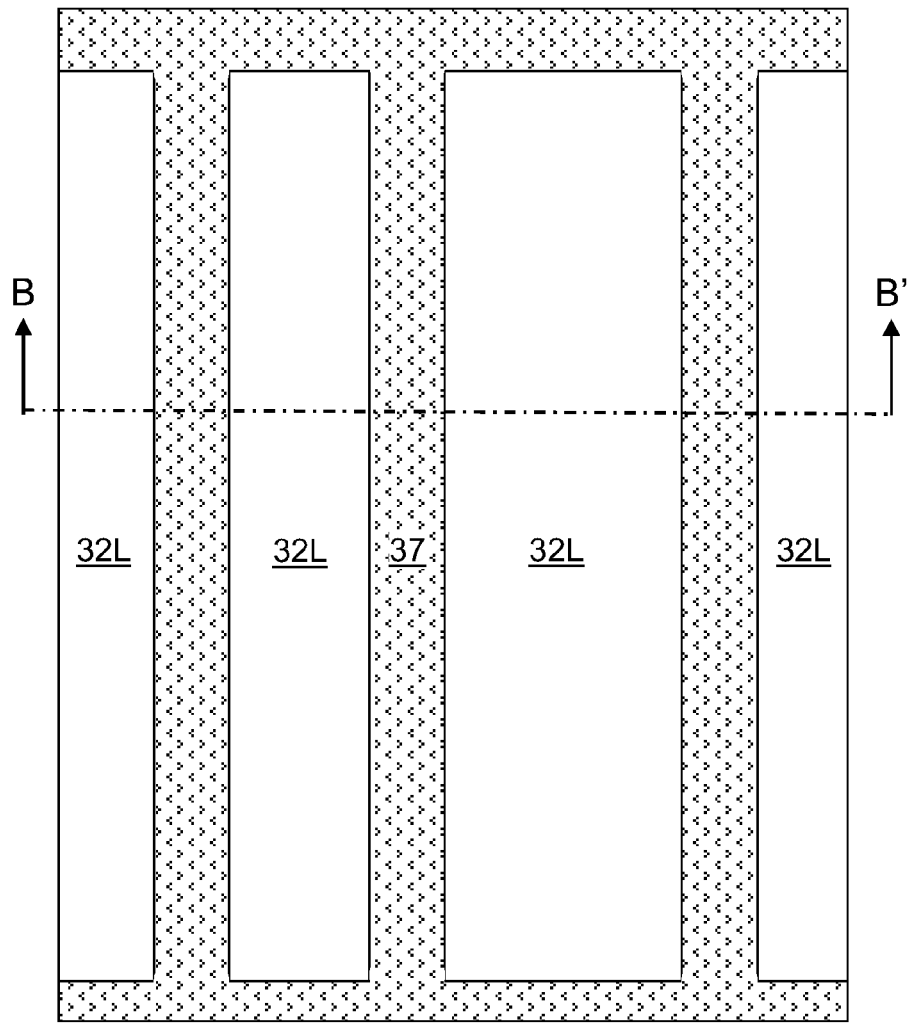
FIG. 1C is a zoomed-out top-down view of the first exemplary patterned structure of FIG. 1A.

Referring to FIGS. 1A, 1B, and 1C, a first exemplary patterned structure according to an embodiment of the present disclosure includes a stack, from bottom to top, of a substrate 10, a first material layer 12L, an underlying organic planarization layer (OPL) 20L, a second material layer 22L, an organic planarization layer (OPL) 30L, a hard mask layer 31L, a buffer polymer layer 32L, and a patterned template layer 37.

The substrate 10 can be a semiconductor substrate, a dielectric substrate, a conductive material substrate, or a combination thereof. In one embodiment, the substrate 10 can include a bulk semiconductor substrate or a semiconductor-on-insulator (SOI) substrate as known in the art. The substrate 10 can optionally include a metal interconnect structure including at least one dielectric material layer and metal lines and/or metal via structures embedded therein. The top surface of the substrate 10 can be planar, or can have a non-planar topography.

The first material layer 12L can be a permanent material layer that is intended to remain at the end of a sequence of processing steps, or a temporary material layer that is intended to be removed after the sequence of processing steps. In one embodiment, the first material layer 12L can be a conductive material layer, a dielectric material layer, a semiconductor material layer, or a stack thereof. In one embodiment, the first material layer 12L can be a dielectric hard mask layer such as a silicon nitride layer or a silicon oxide layer. The thickness of the first material layer 12L can be from 5 nm to 100 nm, although lesser and greater thicknesses can also be employed. The top surface of the first material layer 12L can be planar, or can have a non-planar topography.

The underlying OPL 20L includes a self-planarizing material. As used herein, a self-planarizing material is a material that flows at the standard ambient temperature and pressure (SATP), i.e., 20° C. (293.15 K, 68° F.) and an absolute pressure of 101.325 kPa (14.696 psi, 1 atm), to provide a planar top surface. In one embodiment, the self-planarizing material of the underlying OPL 20L can be an organic material including C, O, and H, and optionally including Si and/or F. The formulation of the underlying OPL 20L can be selected to provide sufficiently low viscosity so that a top surface of the OPL is self-planarizing over underlying topographic features. In one embodiment, the self-planarizing material of the underlying OPL 20 can be an amorphous carbon layer. The thickness of the underlying OPL 20L can be from 10 nm to 300 nm, although lesser and greater thicknesses can also be employed.

The second material layer 22L can be a conductive material layer, a dielectric material layer, a semiconductor material layer, or a stack thereof. In one embodiment, the second material layer 22L can be a dielectric hard mask layer such as a silicon nitride layer or a silicon oxide layer. The thickness of the second material layer 22L can be from 5 nm to 100 nm, although lesser and greater thicknesses can also be employed. The top surface of the second material layer 22L is planar due to the planarity of the top surface of the underlying OPL 20.

The OPL 30L includes a self-planarizing material, which can be selected from any of the self-planarizing material that can be employed for the underlying OPL 20L. The self-planarizing material of the OPL 30L can be the same as, or can be different from, the self-planarizing material of the underlying OPL 20L. In one embodiment, the self-planarizing material of the underlying OPL 30L can be an organic material including C, O, and H, and optionally including Si and/or F. In another embodiment, the self-planarizing material of the OPL 30 can be an amorphous carbon layer. The thickness of the OPL 30L can be from 10 nm to 300 nm, although lesser and greater thicknesses can also be employed.

The hard mask layer 31L is formed on top of the OPL 30L. The hard mask layer 31L includes a hard mask material such as silicon oxide, silicon nitride, silicon oxynitride, or combinations thereof. The hard mask layer 31L can be formed, for example, by chemical vapor deposition (CVD), atomic layer deposition (ALD), or spin-coating. The thickness of the hard mask layer 31L can be from 1 nm to 20 nm, although lesser and greater thicknesses can also be formed. The hard mask layer 31L can be employed to reduce structural or compositional damage to the OPL 30L during removal of polymer blocks at a subsequent processing step.

The buffer polymer layer 32L is formed on top of the hard mask layer 31L. The buffer polymer layer 32L can include, for example, an antireflective coating material and/or a thin dielectric material (such as silicon oxide or silicon nitride) having a thickness from 2 nm to 20 nm, although lesser and greater thicknesses can also be employed. The buffer polymer layer 32L typically has a thickness from 1 nm to 4 nm, although lesser and greater thicknesses can also be employed. In one embodiment, the buffer polymer layer 32L includes a material having substantially the same affinity to two different polymeric block components within a copolymer layer to be subsequently applied thereupon.

The patterned template layer 37 includes at least one trench therein. Each trench in the patterned template layer 37 is contiguously surrounded along a periphery by a set of vertical sidewalls of the patterned template layer. The set of vertical sidewalls laterally encloses the trench. A top surface of the buffer polymer layer 32L can be physically exposed at the bottom of each of the at least one trench.

In one embodiment, the at least one trench can include a rectangular trench having a lengthwise direction and a widthwise direction. The rectangular trench can extend over a greater distance along the lengthwise direction than along the widthwise direction.

In one embodiment, the patterned template layer 37 can be formed by depositing a blanket dielectric material layer, applying a photoresist layer (not shown) thereupon, lithographically patterning the photoresist layer, and transferring the pattern of the photoresist layer into the blanket dielectric material layer. For example, the patterned template layer can include hydrogen silsesquioxane (HSQ) or methyl silsesquioxane (MSQ). The photoresist layer can be removed selective to the patterned template layer, for example, by ashing.

In one embodiment, the patterned template layer 37 can be a patterned photoresist layer. In this case, the patterned template layer 37 can be formed by forming a blanket photoresist layer over the buffer polymer layer 32L, and by lithographically exposing and developing the blanket photoresist layer to form a patterned photoresist layer.

In one embodiment, the material of the patterned template layer 37 can be selected such that the material of the patterned template layer has a greater chemical affinity to one polymer material than to another polymer material in a self-aligning copolymer material to be subsequently employed.

In an alternative embodiment, a polymer layer (not shown) can be deposited in lieu of the neutral polymer layer 32L after formation of the patterned template layer 37 as a conformal material layer that contacts physically exposed portions of the top surface of the hard mask layer 31L and top surfaces and sidewalls of the patterned template layer 37. In this case, the polymer layer can be weakly selective to a second polymeric block component (have a greater affinity to the second polymeric block component) than to a first polymeric block component of a copolymer material to be subsequently employed. The magnitude of the selectivity of the polymer layer can be adjusted so that top the second polymeric block component is selective to the top surface and the sidewalls of the polymer layer above the patterned template layer, and is not selective enough to prevent formation of substantially vertical interfaces between first polymer block and second polymer blocks in the trenches within the patterned template layer 37.

Figure 2A:
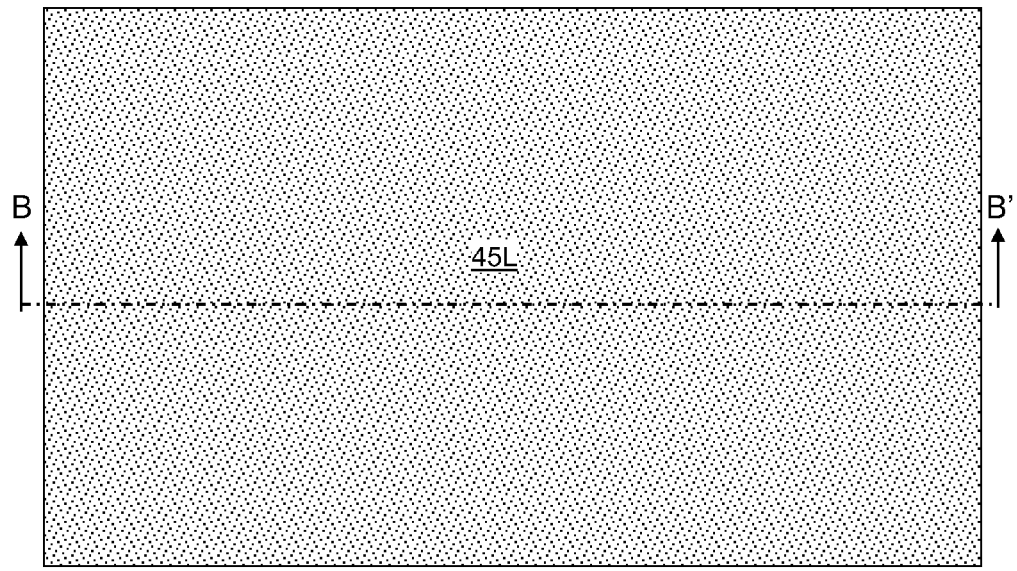
FIG. 2A is a top-down view of the first exemplary patterned structure after application of a copolymer layer according to an embodiment of the present disclosure.
Figure 2B:
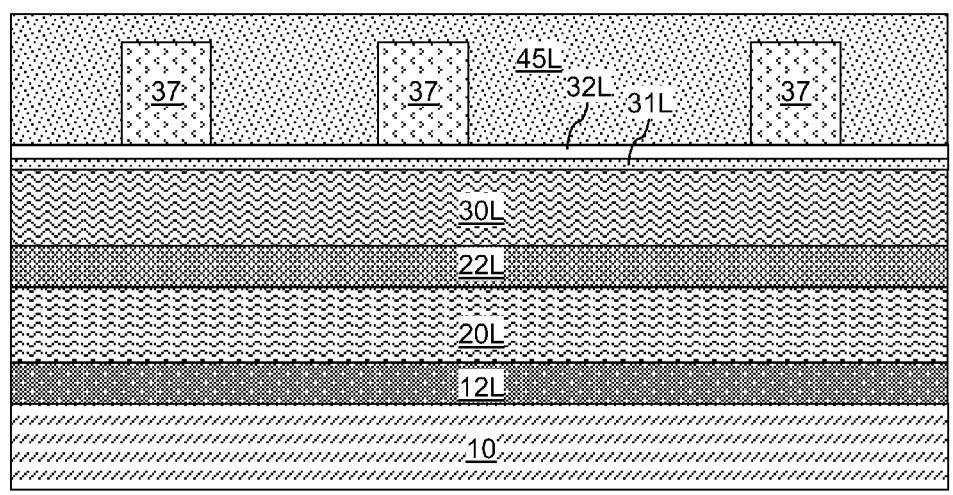
FIG. 2B is a vertical cross-sectional view of the first exemplary patterned structure along the vertical plane B-B' of FIG. 2A.

Referring to FIGS. 2A and 2B, a copolymer material is applied into the at least one trench and over the top surface of the patterned template layer 37 to form a copolymer layer 45L. The copolymer material can be applied, for example, by spin coating. The copolymer material comprises a first polymeric block component and a second polymeric block component that are immiscible with each other. The copolymer material may be self-planarizing. Alternatively, the copolymer material may be planarized by chemical mechanical planarization, a recess etch, or a combination thereof. The copolymer material is applied and planarized so that the topmost surface of the copolymer material is above the topmost surface of the patterned template layer 37. The copolymer material includes self-assembling block copolymers that are capable of self-organizing into nanometer-scale patterns.

The copolymer layer 45L can include a first polymer material, i.e., a first polymeric block component, and a second polymer material, i.e., a second polymeric block component. The first polymeric block component and the second polymeric block component are selected such that a self-aligned assembly of first polymer blocks including the first polymeric block component and second polymer blocks including the second polymeric block component can be subsequently formed upon phase separation of the first and second polymeric block components.

Exemplary materials for the first polymeric block component and the second polymeric block component are described in U.S. Pat. No. 7,605,081 to Yang et al., issued on Oct. 20, 2009, the contents of which are incorporated herein by reference. Specific examples of self-assembling block copolymers may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The self-assembling block copolymers are first dissolved in a suitable solvent system to form a block copolymer solution, which is then applied into the at least one trench and over the top surface of the patterned template layer 37 to form the polymer layer 45L. The solvent system used for dissolving the block copolymer and forming the block copolymer solution may include any suitable solvent, which can include, but is not limited to: toluene, propylene glycol monomethyl ether acetate (PGMEA), propylene glycol monomethyl ether (PGME), and acetone. The copolymer material is not a conventional photoresist that may be developed upon exposure to ultraviolet light or optical light. Also, the copolymer layer 45L is not a conventional low-k dielectric material.

Figure 3A:
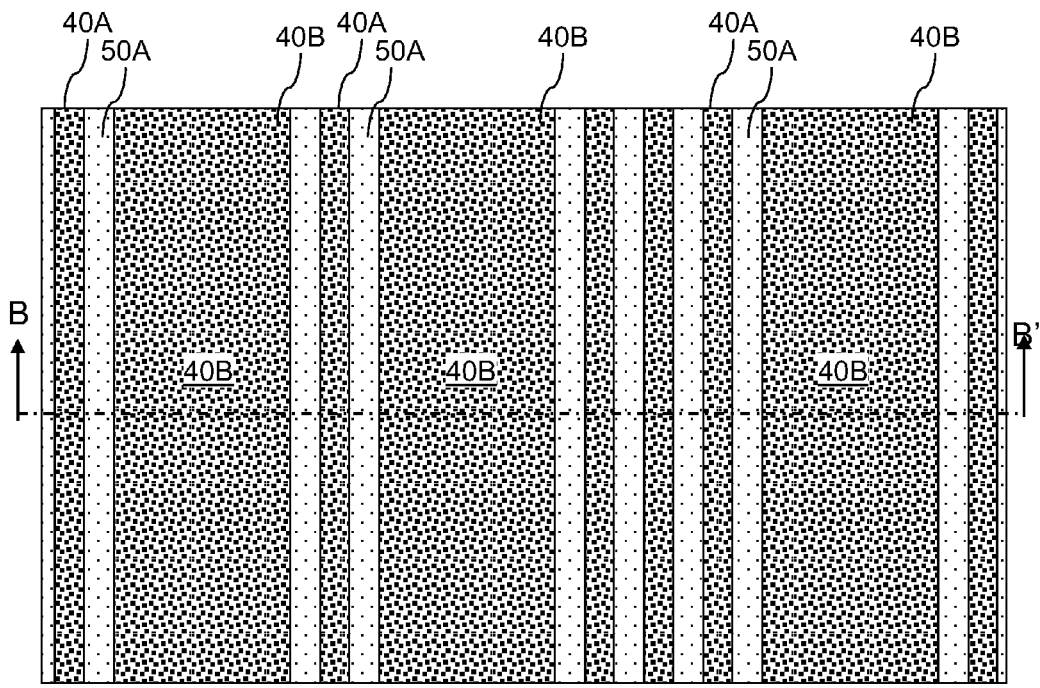
FIG. 3A is a top-down view of the first exemplary patterned structure after phase separation of the copolymer material in the copolymer layer according to an embodiment of the present disclosure.
Figure 3B:
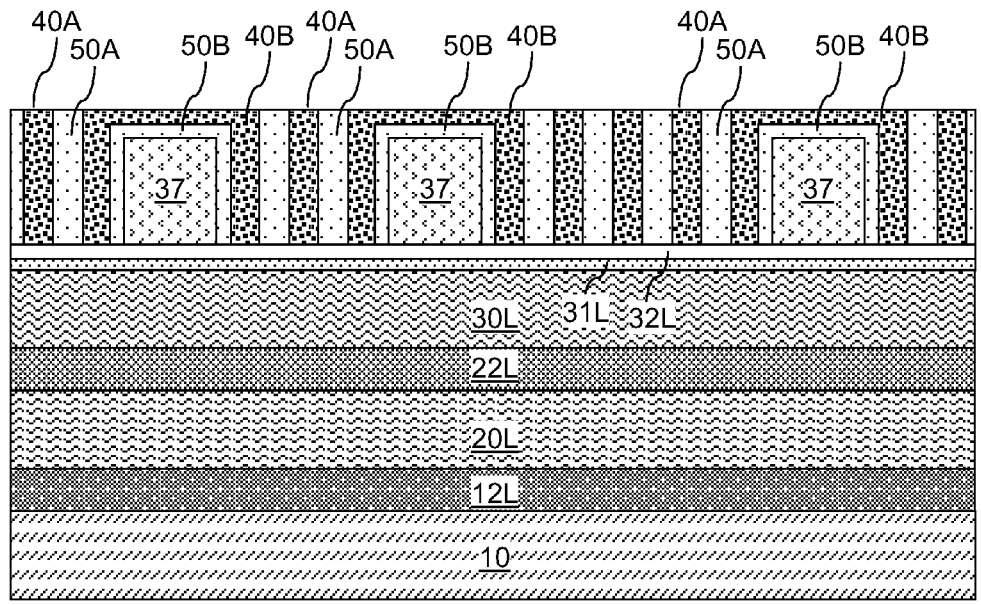
FIG. 3B is a vertical cross-sectional view of the first exemplary patterned structure along the vertical plane B-B' of FIG. 3A.
Figure 3C:
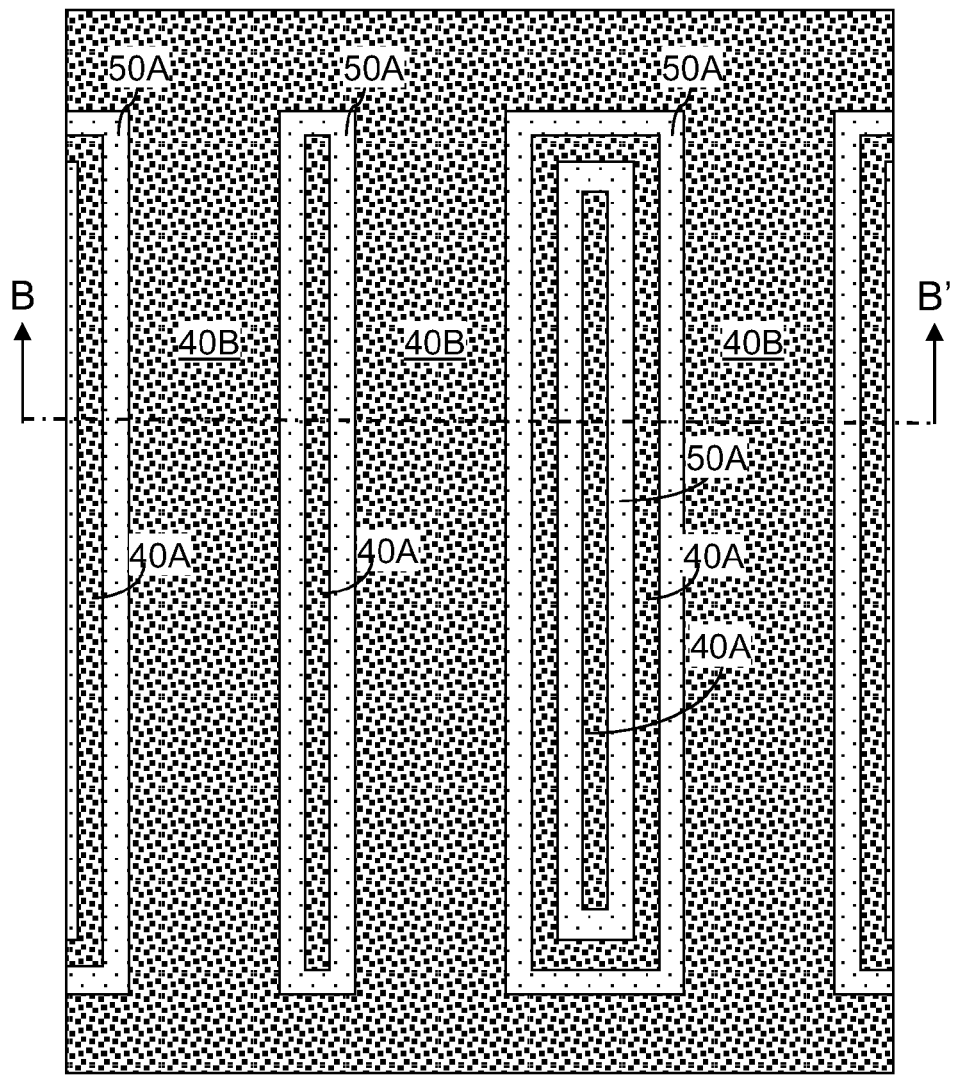
FIG. 3C is a zoomed-out top-down view of the first exemplary patterned structure of FIG. 3A.

Referring to FIGS. 3A, 3B, and 3C, a nanoscale self-assembled self-aligned structure is formed within each of the at least one trench and over the patterned template layer 37 by causing phase separation of the self-assembling block copolymers through annealing. The nanoscale self-assembled self-aligned structure is self-aligned to the vertical sidewalls of the patterned template layer 37 within each of the at least one trench, and is herein referred to as a "self-aligned assembly." In one embodiment, the copolymer layer 45L is annealed by ultraviolet treatment or by thermal annealing at an elevated temperature to form first polymer blocks (40A, 40B) including the first polymeric block component and second polymer blocks (50A, 50B) including the second polymeric block component. The anneal may be performed, for example, at a temperature from about 200° C. to about 300° C. for a duration from 30 seconds to about 10 hours.

The composition and wetting properties of the copolymer layer 45L can be adjusted such that either some of the first polymer blocks (40A, 40B) or some of the second polymer blocks (50A, 50B) wet the sidewalls and the top surface of the patterned template layer 37. In one embodiment, the patterned template layer 37 can include a material having a greater chemical affinity to the second polymeric block component than to the first polymeric block component. In this case, the composition and wetting properties of the copolymer layer 45L can be adjusted such that some of the second polymer blocks (50A, 50B) wet the sidewalls and the top surface of the patterned template layer 37.

The first polymer blocks (40A, 40B) include first-type first polymer blocks 40A and at least one second-type first polymer block 40B. Each of the first-type first polymer blocks 40A has a first uniform width between the bottommost surface of the self-aligned assembly (40A, 40B, 50A, 50B) and the topmost surface of the self-aligned assembly (40A, 40B, 50A, 50B). The at least one second-type first polymer block 40B includes a horizontal portion overlying a portion of the patterned template layer 37 and two vertical portions contacting a top surface of the buffer polymer layer 32L.

For each rectangular trench formed by the patterned template layer 37 and filled with the self-aligned assembly (40A, 40B, 50A, 50B), at least one of the first-type first polymer blocks 40A having the first uniform width can extend along the lengthwise direction of the rectangular trench within the patterned template layer 37, and at least one of the first-type second polymer blocks 50A having the second uniform width can extend along the lengthwise direction of the rectangular trench within the patterned template layer 37.

In one embodiment, a plurality of first-type first polymer blocks 40A and a plurality of first-type second polymer blocks 50A can be present in a trench formed by the patterned template layer 37. In this case, the self-aligned assembly (40A, 40B, 50A, 50B) of the first polymer blocks (40A, 40B) and the second polymer blocks (50A, 50B) includes a region of a one-dimensional periodic array of at least two periodic repetitions of a set of a first polymer line portion of a first-type first polymer block 40A and a second polymer line portion of a first-type second polymer block 50A.

In one embodiment, the first uniform width can be in a range from 3 nm to 25 nm, and the second uniform width can be in a range from 3 nm to 25 nm. In one embodiment, the sum of the first uniform width and the second uniform width can be in a range from 6 nm to 50 nm.

Each of the two vertical portions of a second-type first polymer block 40B has the first uniform width between the bottommost surface of the self-aligned assembly (40A, 40B, 50A, 50B) and a height that is above a top surface of the portion of the patterned template layer 37 and is below the topmost surface of the self-aligned assembly (40A, 40B, 50A, 50B). One of the two vertical portions can be formed on one side of the portion of the patterned template layer 37 and another of the two vertical portions can be formed on another side of the portion of the patterned template layer 37.

The second polymer blocks (50A, 50B) include first-type second polymer blocks 50A and at least one second-type second polymer block 50B. Each of the first-type second polymer blocks 50A has a second uniform width between the bottommost surface of the self-aligned assembly (40A, 40B, 50A, 50B) and the topmost surface of the self-aligned assembly (40A, 40B, 50A, 50B). The at least one second-type second polymer block 50B includes a horizontal portion in contact with a top surface of the portion of the patterned template layer 37 and two vertical portions contacting sidewalls of the portion of the patterned template layer 37. Each of the two vertical portions can have a width that is less than the second uniform width.

The chemical composition of the copolymer layer 45L is such that the immiscibility of the first and second polymeric block components enable self assembly of the first polymeric block component into primary lamellar structures of the first polymer blocks (40A, 40B) and the second polymeric block component assembles into complementary lamellar structures of the second polymer blocks (50A, 50B). The first polymer blocks (40A, 40B) constitute the primary lamellar structures including the first polymeric block component, and the second polymer blocks (50A, 50B) constitute the complementary lamellar structures including the second polymeric block component. The first-type first polymer blocks 40A and the first-type second polymer blocks 50A alternate with periodicity in the direction perpendicular to the lengthwise direction of each trench within the patterned template layer 37. For each rectangular trench within the patterned template layer, the first-type first polymer blocks 40A and the first-type second polymer blocks 50A alternate with periodicity in the direction perpendicular to the lengthwise direction of the rectangular trench.

Each second-type second polymer block 50B wets the sidewalls and the top surface of a portion of the patterned template layer 37. Each second-type first polymer block 40B is vertically and laterally spaced from the portion of the patterned template layer 37 by the second-type second polymer bock 50B. Thus, a horizontal stack of a first polymer block portion (i.e., a horizontal portion of a second-type first polymer bock 40B) and a second polymer block portion (i.e., a horizontal portion of a second-type second polymer block 50B) can be formed over a portion of the patterned template layer 37 within the self-aligned assembly (40A, 40B, 50A, 50B).

In one embodiment, the first polymeric block component can be polystyrene, and the second polymeric block component can be poly(methyl methacrylate) (PMMA). In this case, the sum of the first uniform width and the second uniform width can be about 28 nm.

The presence of the buffer polymer layer 32L is critical for enabling the outcome of the annealing, i.e., the phase separation of the first polymeric block component and the second polymeric block component without intermixing with the material of the OPL 30L. The buffer polymer layer 32L includes a material that is neutral to the first polymeric block component and the second polymeric block component, i.e., having a same affinity to the first polymeric block component and the second polymeric block component. Thus, each component polymer block in the self-aligned assembly (40A, 40B, 50A, 50B) can be perpendicular to the top surface of the buffer polymer layer 32L. Without such neutrality, the domains of the component polymer blocks tend to lay parallel from the top surface of the buffer polymer layer 32L.

Figure 4A:
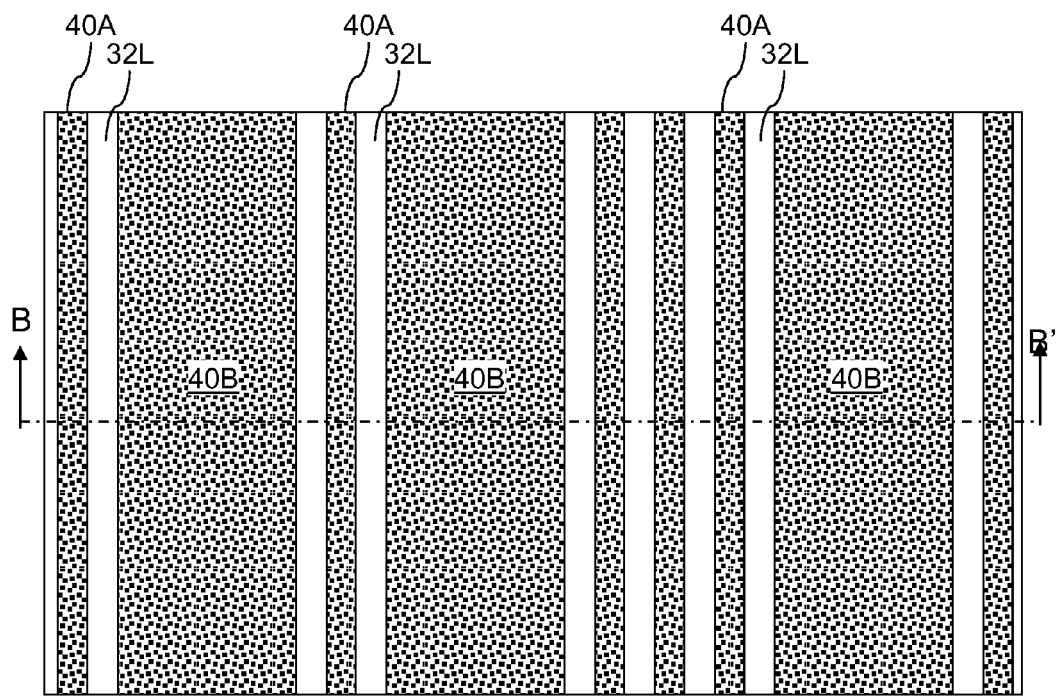
FIG. 4A is a top-down view of the first exemplary patterned structure after removal of second polymer blocks selective to first polymer blocks and formation of a first pattern including the first polymer blocks according to an embodiment of the present disclosure.
Figure 4B:
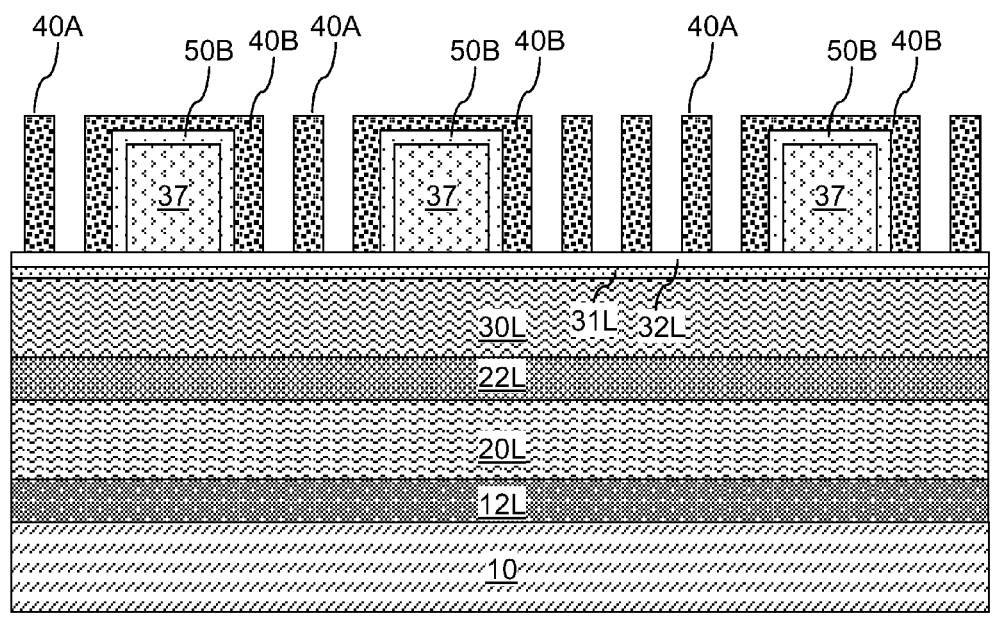
FIG. 4B is a vertical cross-sectional view of the first exemplary patterned structure along the vertical plane B-B' of FIG. 4A.

Referring to FIGS. 4A and 4B, physically exposed second polymer blocks, which are first-type second polymer blocks 50A, are removed selective to first polymer blocks (40A, 40B). The removal of the first-type second polymer blocks 50A can be performed, for example, by an anisotropic etch that removes the second polymeric block component selective to the first polymeric block component.

A first pattern including the first polymer blocks (40A, 40B) are formed over the buffer polymer layer 32L. The first polymer blocks (40A, 40B) constitute a set of protruding structures that protrude above the top surface of the buffer polymer layer 32L. The area in which the first polymer blocks (40A, 40B) are present defines the area of the first pattern.

The area of the first pattern includes a narrow pitch region in which the pitch of a one-dimensional periodic array of the first-type first polymer blocks 40A can be a sublithographic dimension, i.e., a dimension that is less than the minimum pitch of a pattern that can be printed by a single lithographic exposure tool known in the art. Further, the area of the first pattern includes a wide line region in which a second-type first polymer block 40B is present. The width of each wide line region can be from about twice the minimum lithographic pitch to ten times the minimum lithographic pitch, although lesser and greater widths can also be employed.

Figure 5A:
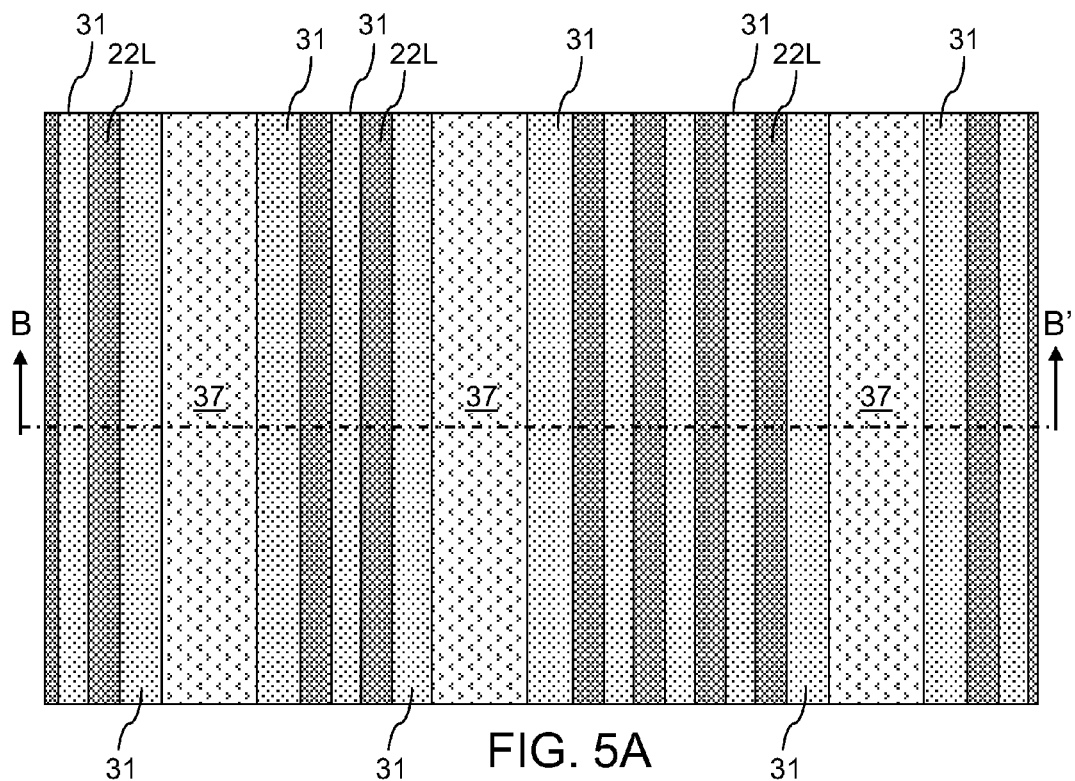
FIG. 5A is a top-down view of the first exemplary patterned structure after etching the OPL layer employing the first polymer blocks as an etch mask according to an embodiment of the present disclosure.
Figure 5B:
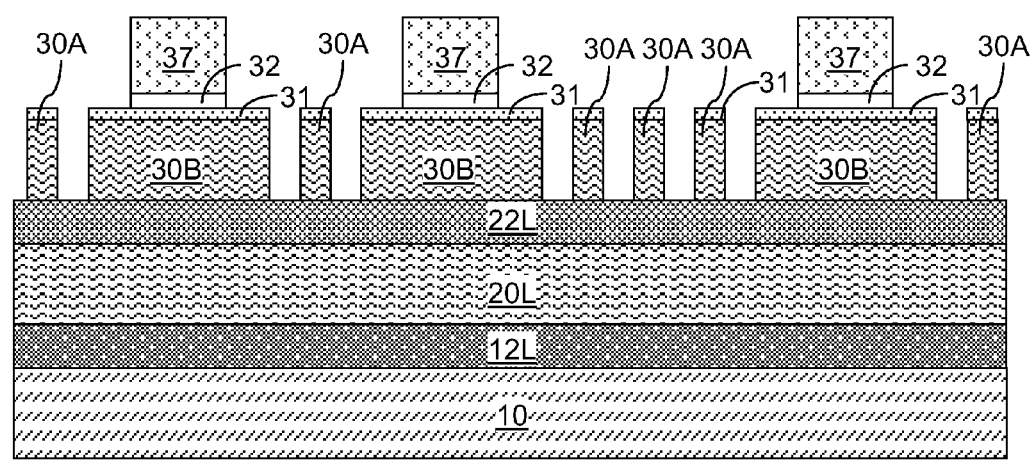
FIG. 5B is a vertical cross-sectional view of the first exemplary patterned structure along the vertical plane B-B' of FIG. 5A.

Referring to FIGS. 5A and 5B, the first pattern is transferred into the buffer polymer layer 32L, the hard mask layer 31L, and the OPL 30L by an anisotropic etch that employs at least the first polymer blocks (40A, 40B) as an etch mask. The chemistry of the anisotropic etch can be selected so that the materials of the hard mask layer 31L and the OPL 30L are etched, while the material(s) of the etch mask is/are not significantly etched. In one embodiment, the combination of the first polymer blocks (40A, 40B) and the patterned template layer 37 and optionally the second-type second polymer blocks 50B can be employed as an etch mask. In another embodiment, the first polymer blocks (40A, 40B) alone can be employed as an etch mask. The physically exposed portions of the hard mask layer 31L and the OPL 30L are etched through until the top surface of the second material layer 22L is physically exposed underneath each trench in the patterned OPL. The pattern defined by the combination of the first polymer blocks (40A, 40B), the patterned template layer 37, and the second-type second polymer blocks 50B at the processing step of FIGS. 4A and 4B is replicated within the remaining portions of the hard mask layer 31L and the OPL 30L.

Some or all of the first polymer bocks (40A, 40B) may be consumed during the anisotropic etch. Further, some or all of the second-type second polymer blocks 50B may be consumed during the anisotropic etch. Yet further, physically exposed portions of the buffer polymer layer 32L can be fully or partially removed. In some embodiments, some of the patterned template layer 37 may be consumed during the anisotropic etch. In some embodiment, some or all of the portions of the buffer polymer layer 32L that are not physically covered by the patterned template layer 37 can be removed. Remaining portions of the buffer polymer layer 32L are herein referred to as buffer polymer portions 32.

The remaining portions of the hard mask layer 31L are herein referred to as hard mask portions 31. The patterned OPL includes a contiguous patterned organic planarization layer (OPL) 30B located in the area in which the second-type first polymer blocks 40B are present prior to the anisotropic etch (See FIGS. 4A and 4B), and further includes organic planarization layer (OPL) portions 30A located in areas in which the first-type first polymer blocks 40A are present prior to the anisotropic etch.

Figure 6A:
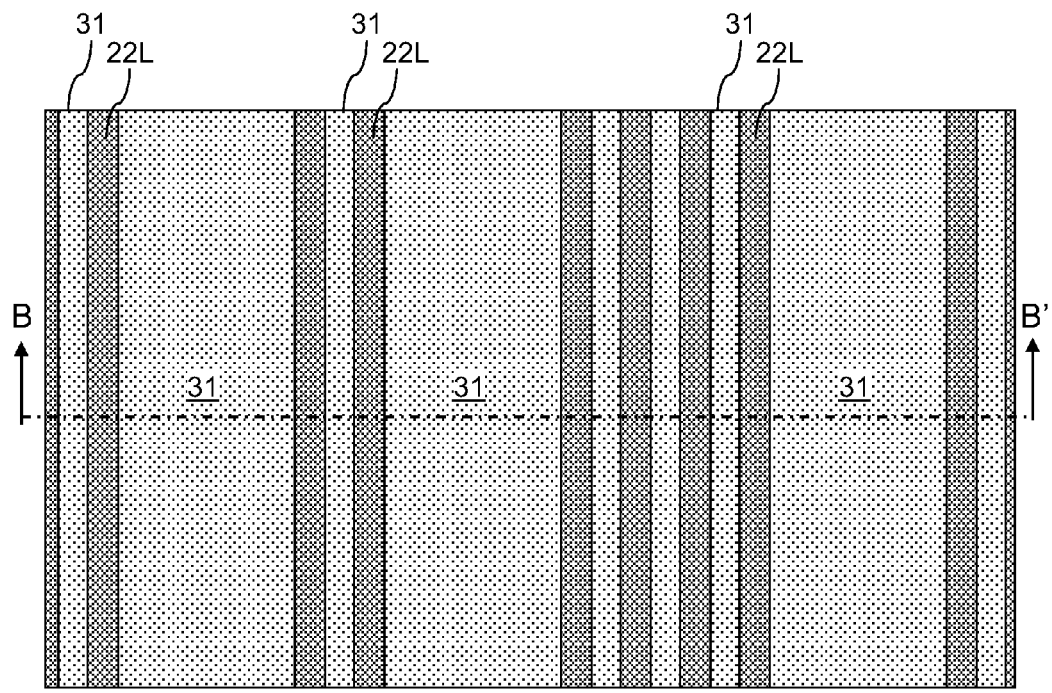
FIG. 6A is a top-down view of the first exemplary patterned structure after removal of remaining portions of the template layer according to an embodiment of the present disclosure.
Figure 6B:
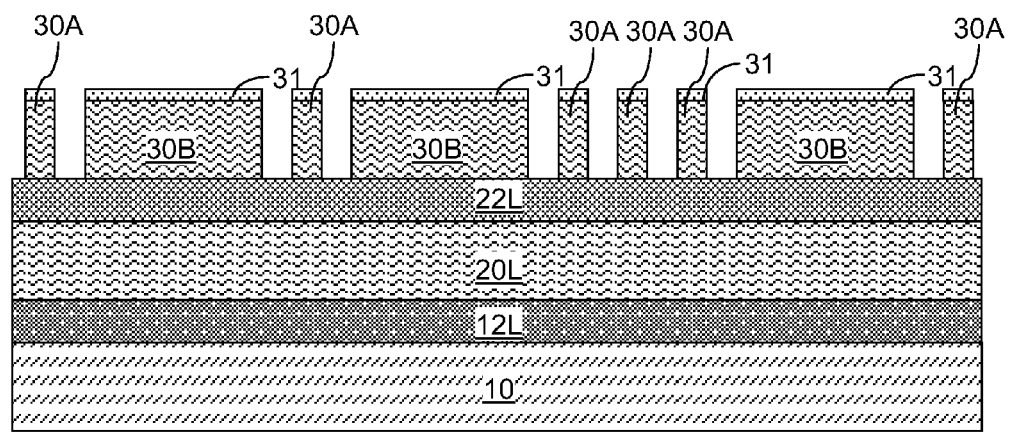
FIG. 6B is a vertical cross-sectional view of the first exemplary patterned structure along the vertical plane B-B' of FIG. 6A.

Referring to FIGS. 6A and 6B, any remaining portions of the patterned template layer 37 and buffer polymer portions 32 are removed selective to the material of the hard mask portions 31 and selective to the material of the patterned OPL (30A, 30B) that includes the OPL portions 30A and the contiguous patterned OPL 30B. In one embodiment, the removal of the remaining portions of the patterned template layer 37 can be performed by employing a solvent or etchant that dissolves the material of the patterned template layer 37 while not dissolving the material of the patterned OPL (30A, 30B). In another embodiment, if the patterned template layer 37 includes a photoresist material, the patterned template layer 37 and the buffer polymer portions 32 can be removed by ashing under processing conditions that do not consume the patterned OPL (30A, 30B). For example, the temperature of the ashing process can be selected to remove the patterned template layer 37 without consuming the patterned OPL (30A, 30B). The presence of the hard mask portions 31 helps erosion of the material of the patterned OPL (30A, 30B), and to preserve the fidelity of the pattern in the patterned OPL (30A, 30B) during the removal of the patterned template layer 37 and the buffer polymer portions 32.

Figure 7A:
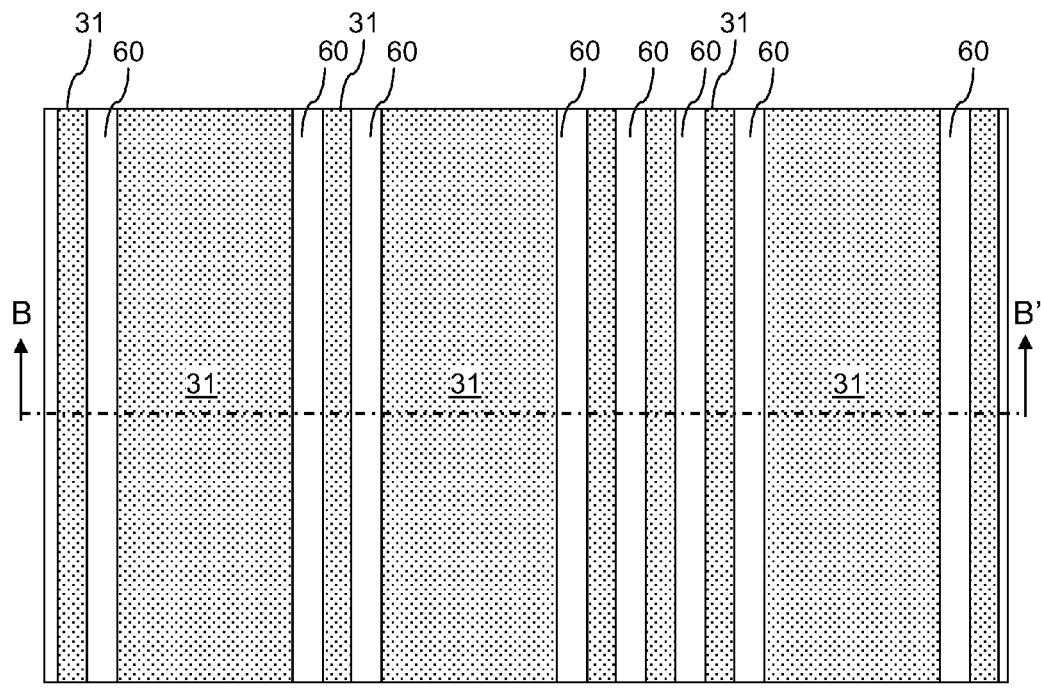
FIG. 7A is a top-down view of the first exemplary patterned structure after application of a spin-on dielectric (SOD) material and formation of a second pattern including SOD portions according to an embodiment of the present disclosure.
Figure 7B:
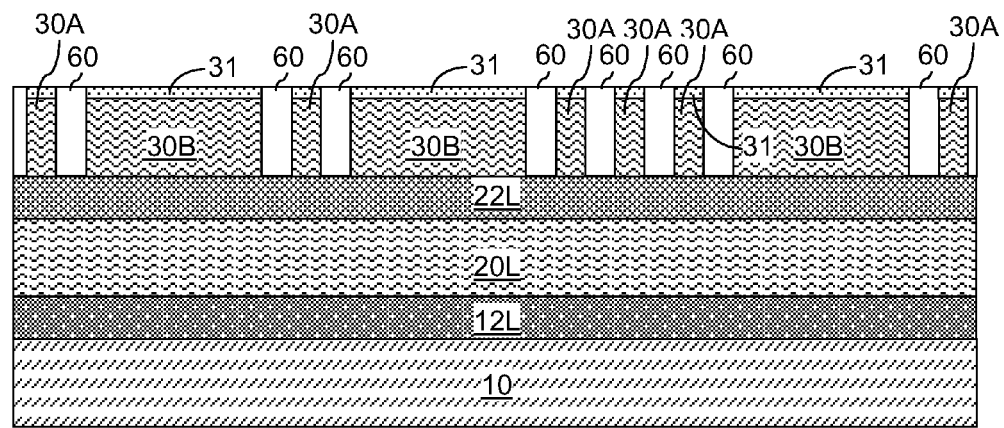
FIG. 7B is a vertical cross-sectional view of the first exemplary patterned structure along the vertical plane B-B' of FIG. 7A.

Referring to FIGS. 7A and 7B, a spin-on dielectric (SOD) material is applied into the trenches in the stack of the patterned OPL (30A, 30B) and the hard mask portions 31 to form spin-on dielectric (SOD) portions 60. The SOD material can be any material that can be applied by spin-coating as known in the art. Thus, each SOD portion 60 is formed by filling a trench within the stack of the patterned OPL (30A, 30B) and the hard mask portions 31 with the SOD material. The SOD material can be applied to a height that does not exceed the topmost surface of the patterned OPL (30A, 30B). In one embodiment, the height of the top surface of the SOD portions 60 can be coplanar with the top surface of the hard mask portions 31. In another embodiment, the height of the top surface of the SOD portions 60 can be located at a horizontal plane that is lower than the top surface of the hard mask portions.

The SOD portions 60 form a second pattern that is the complementary pattern of the first pattern. In other words, the area in which the second pattern is present is the complement of the area in which the first pattern is present as seen in a top-down view. It is understood that the complement of the area in which the first pattern is present is defined within the area of the OPL 30 as originally formed on the substrate 10.

The SOD portions 60 and the vertical stack of the OPL (30A, 30B) and the hard mask portions 31 collectively constitute a pattern-containing layer (60, 30A, 30B), which includes the first pattern defined by the vertical stack of the patterned OPL (30A, 30B) and the hard mask portions 31 and the second pattern defined by the SOD portions 60. The pattern-containing layer (60, 30A, 40B, 31) is located over the substrate 10. A lower portion of the pattern-containing layer (60, 30A, 40B, 31) under the horizontal plane of the bottom surface of the hard mask portions 31 and is complementarily filled with a matrix of the contiguous patterned OPL 30B and at least one nested structure (60, 30A) embedded therein.

Each of the at least one nested structure (60, 30A) includes a SOD portion 60 having outer vertical surfaces that contact vertical surfaces of the contiguous patterned OPL 30B. At least one of the at least one nested structure (60, 30A) includes an SOD portion 60 having outer vertical surfaces that contact vertical surfaces of the contiguous patterned OPL 30B and an OPL portion 30A having outer surfaces that contact inner vertical surfaces of the SOD portion 60.

In one embodiment, the outer surfaces of an SOD portion 60 can be located on four vertical surfaces of a rectangular parallelepiped that coincide with interfaces between the contiguous patterned OPL 30B and the SOD portion 60. In one embodiment, the rectangular parallelepiped can have a horizontal cross-sectional area of a rectangle having a lengthwise direction and a widthwise direction. The rectangle can extend over a greater distance along the lengthwise direction than along the widthwise direction. For example, the rectangle can extend along a horizontal direction that is perpendicular to the vertical plane B-B' in FIGS. 7A and 7C than along a horizontal direction within the vertical plane B-B' in FIGS. 7A and 7C.

In one embodiment, an OPL portion 30A can have a horizontal cross-sectional shape of a first rectangular ring having the first uniform width throughout, i.e., having the same uniform width as the width of the first-type first polymer blocks 40A (See FIGS. 3A-3C). As used herein, a "rectangular ring" refers to a shape defined by removing the shape of a smaller rectangle from the shape of a larger rectangle such that the smaller rectangle does not overlie or contact any periphery of the larger rectangle. In one embodiment, an SOD portion 60 can have a horizontal cross-sectional shape of a second rectangular ring having the second uniform width throughout, i.e., having the same uniform width as the width of the first-type second polymer blocks 50A (See FIGS. 3A-3C). The first rectangular ring can be nested within the second rectangular ring such that the outer periphery of the first rectangular ring coincides with the inner periphery of the second rectangular ring.

In one embodiment, the first uniform width can be in a range from 3 nm to 25 nm, and the second uniform width can be in a range from 3 nm to 25 nm. In one embodiment, the sum of the first uniform width and the second uniform width can be in a range from 6 nm to 50 nm.

In one embodiment, one of the at least one nested structure (60, 30A) can further include another SOD portion 60 (i.e., one of the SOD portions 60 that do not contact the contiguous patterned OPL 30B) having outer vertical surface that contact inner vertical surfaces of an OPL portion 30A, and another OPL portion 30A (i.e., an OPL portion 30A that is nested within the another SOD portion 60) having outer surfaces that contact inner vertical surfaces of the another SOD portion 60.

In one embodiment, the another OPL portion 30A can have a horizontal cross-sectional shape of a third rectangular ring having the first uniform width throughout, and the another SOD portion 60 can have a horizontal cross-sectional shape of a fourth rectangular ring having the second uniform width throughout. The third rectangular ring can be nested within the fourth rectangular ring such that the outer periphery of the third rectangular ring coincides with the inner periphery of the fourth rectangular ring. Further, the fourth rectangular ring can be nested within the first rectangular ring such that the outer periphery of the fourth rectangular ring coincides with the inner periphery of the first rectangular ring.

The contiguous patterned OPL 30B and the OPL portion 30A have the same composition, i.e., the composition of the OPL 30L as formed at the processing steps of FIGS. 1A-1C. In one embodiment, the contiguous patterned OPL 30B and the OPL portion 39A include amorphous carbon. In another embodiment, the contiguous patterned OPL 30B and the OPL portion 30A can include a self-planarizing organic material including at least C, O, and H.

In one embodiment, the SOD portion 60 can include a liquid solution of a dielectric material in a carrier solvent. In one embodiment, the SOD portion 60 can include a material selected from hydrogen silsesquioxane and methyl-silsesquioxane and dissolved in the carrier solvent. In one embodiment, the SOD portion 60 can include a liquid solution of a polymeric material in a carrier solvent. For example, the SOD portion 60 can include a liquid solution of a thermally-curable material selected from polysilazane, polyimide, polynorbornenes, benzocyclobutene, and polytetrafluoroethylene (PTFE) in the carrier solvent.

Figure 7C:
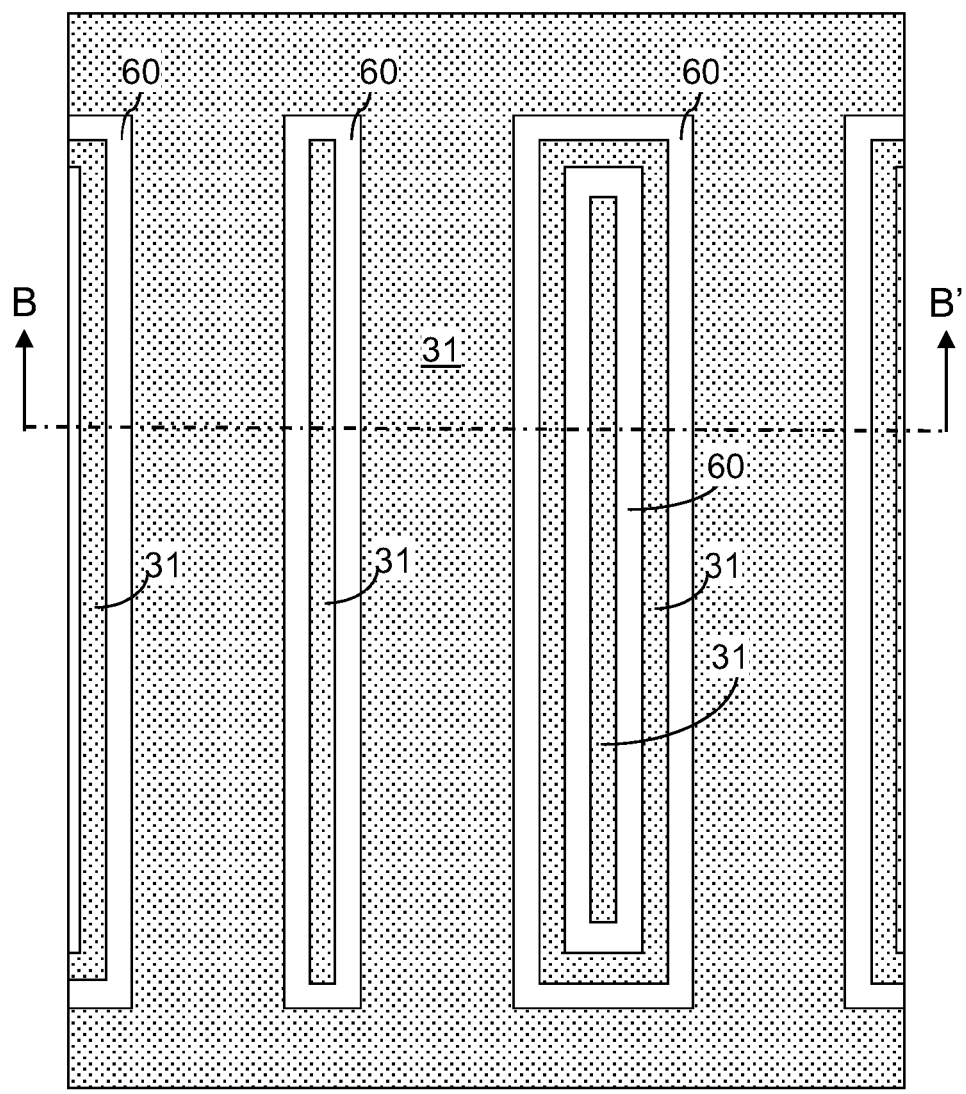
FIG. 7C is a zoomed-out top-down view of the first exemplary patterned structure of FIG. 7A.

The SOD portions 60 are cured, for example, by annealing the first exemplary structure of FIGS. 7A-7C at an elevated temperature at which a predominant portion of the carrier solvent evaporates. The temperature and the duration of the anneal for curing the SOD portions 60 can be selected such that at least 95% of the carrier solvent is evaporated. Thus, after the curing of the SOD portions 60, the SOD portions include a cured spin-on dielectric material.

Alternately, the curing of the SOD portions 60 can be performed by employing alternate curing methods such as an oxygen plasma cure, an ultraviolet cure, and a combination of at least two of an oxygen plasma cure, ultraviolet cure, and a thermal cure.

The curing of the SOD portions 60 typically causes the volume of each SOD portion to shrink, for example, by a percentage in a range from 5% to 20%. Thus, the top surfaces of the SOD portions 60 become recessed relative to the top surface of the contiguous patterned OPL 30B and the OPL portions 30A. Thus, the topmost surfaces of the SOD portions 60 are located below the plane of the top surface of the contiguous patterned OPL 30B and the OPL portions 30A.

In one embodiment, a residual amount of the carrier solvent can remain in the SOD portions 60 after the curing step. In this case, the cured spin-on dielectric material of the SOD portions 60 can include an organic solvent at an atomic concentration of at least 0.01%.

In one embodiment, the SOD material can be a spin-on glass (SOG) material. In this case, the cured spin-on dielectric material includes $SiO_x$, in which x is in a range from 1.25 to 1.75.

In one embodiment, the cured spin-on dielectric material of the SOD portions 60 can include carbon at an atomic concentration of at least 0.5%, which can be due to residual carbon-containing polymers.

In one embodiment, the cured spin-on dielectric material can include an organic polymeric material. For example, the cured spin-on dielectric material can include a material selected from polysilazane, polyimide, polynorbornenes, benzocyclobutene, and polytetrafluoroethylene (PTFE).

Figure 8A:
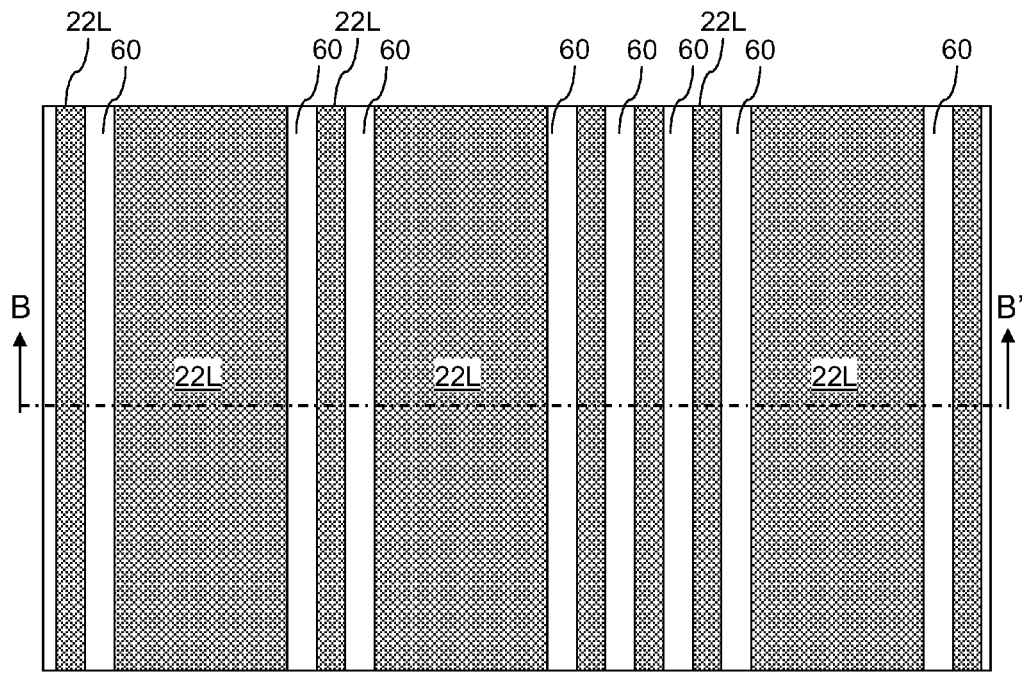
FIG. 8A is a top-down view of the first exemplary patterned structure after removal of remaining portions of the OPL according to an embodiment of the present disclosure.
Figure 8B:
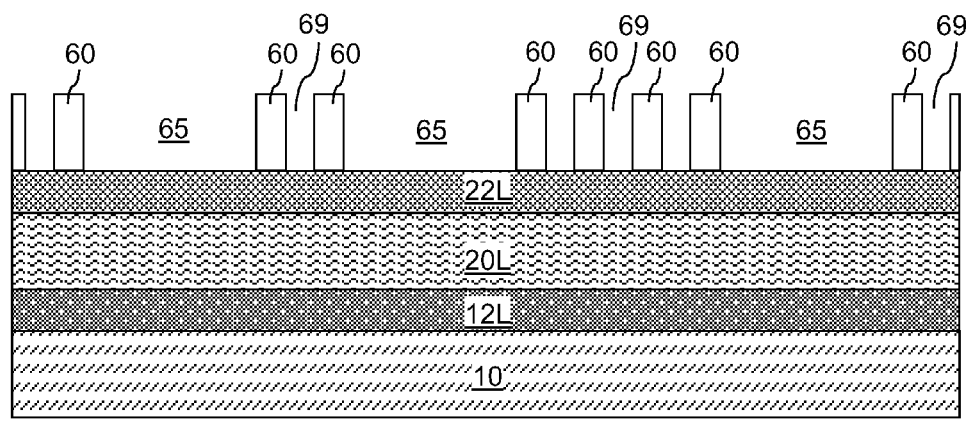
FIG. 8B is a vertical cross-sectional view of the first exemplary patterned structure along the vertical plane B-B' of FIG. 8A.

Referring to FIGS. 8A and 8B, the stack of the hard mask portions 31 and the patterned OPL (30A, 30B) (which is the remaining portions of the OPL 30L in FIGS. 1A-1C) is removed selective to the SOD portions 60. The removal of the hard mask portions 31 can be performed by a wet etch. The removal of the patterned OPL (30A, 30B) can be performed, for example, by ashing. The SOD portions are a set of protruding structures that are located above a planar top surface of the second material layer 22L, and as such, define the second pattern that is the complementary pattern of the first pattern. Thus, the processing steps of FIGS. 5A, 5B, 6A, 6B, 7A-7C, 8A and 8B provide a tone inversion of a pattern such that the first pattern of protruding structures present in the first exemplary structure of FIGS. 4A and 4B becomes a pattern of trenches in the first exemplary structure of FIGS. 8A and 8B. Further, the second pattern of protruding structures including the SOD portions 60 that is present in the first exemplary structure of FIGS. 8A and 8B is the complementary pattern of the first pattern, i.e., is present in the complementary area of the area of the first pattern.

A cluster of SOD portions 60 located in proximity with one another constitute a periodic structure having a pitch that is equal to the sum of the first uniform width and the second uniform width. Each SOD portion 60 can have a width that is the same as the second uniform width, i.e., the width of first-type second polymer blocks 50A. A narrow trench 69 located between a pair of SOD portions 60 within the cluster has a uniform width, which is the same as the first uniform width, i.e., the width of first-type first polymer blocks 40A. A wide trench 65 is formed in each area from which the patterned template layer 37 is removed. Each wide trench can separate clusters of SOD portions 60.

Figure 9A:
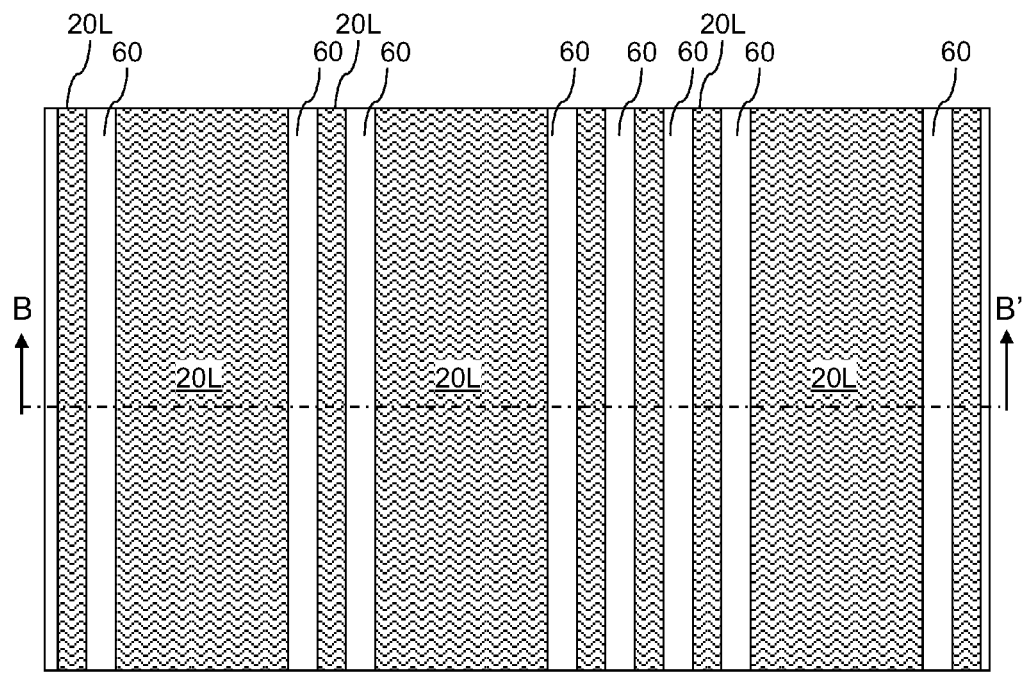
FIG. 9A is a top-down view of the first exemplary patterned structure after transfer of the second pattern into a second material layer by an anisotropic etch according to an embodiment of the present disclosure.
Figure 9B:
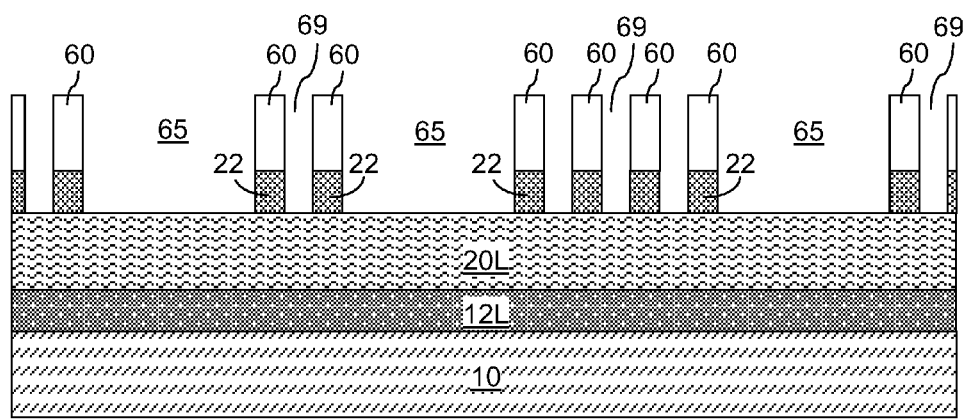
FIG. 9B is a vertical cross-sectional view of the first exemplary patterned structure along the vertical plane B-B' of FIG. 9A.

Referring to FIGS. 9A and 9B, the second pattern present in the SOD portions 60 can be subsequently transferred into underlying material layers. For example, the second pattern can be transferred into the second material layer 22L employing the SOD portions 60 as an etch mask. The remaining portions of the second material layer 22L constitute second material portions 22 that replicate the second pattern. Some, all, or none, of the SOD portions 60 may be consumed during the anisotropic etch that transfers the second pattern into the second material portions 22.

In one embodiment, the second material layer 22L can be a dielectric hard mask layer including a dielectric material such as silicon oxide, silicon nitride, silicon oxynitride, or a combination thereof. In this case, the second material portions 22 can function as a hard mask for subsequent anisotropic etches to be employed to further transfer the second pattern to layers located underneath the second material portions 22.

Figure 10A:
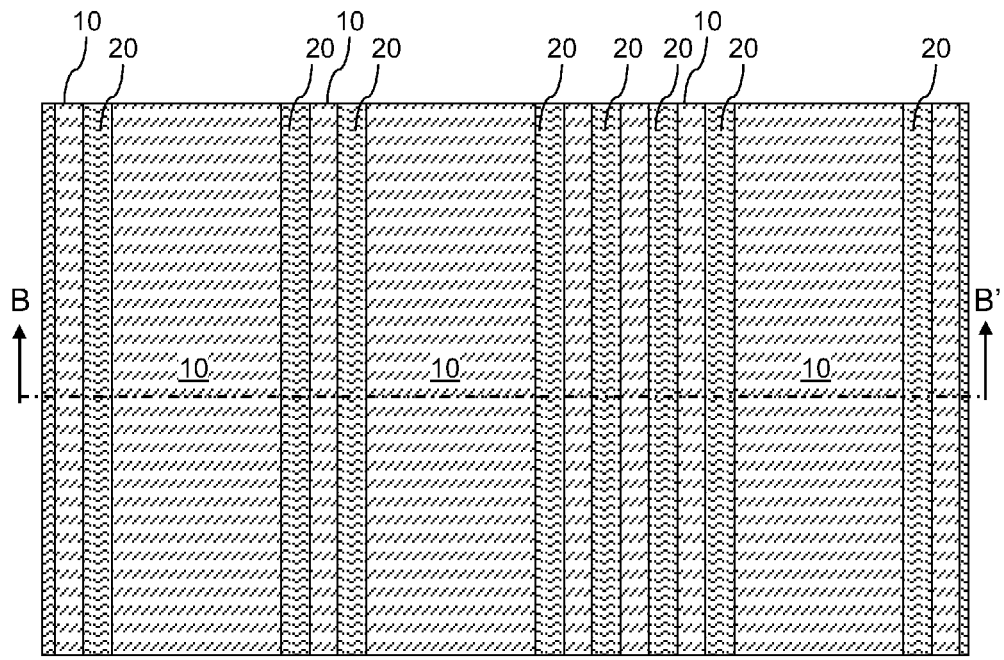
FIG. 10A is a top-down view of the first exemplary patterned structure after transfer of the second pattern into an underlying OPL and a first material layer by at least one anisotropic etch according to an embodiment of the present disclosure.
Figure 10B:
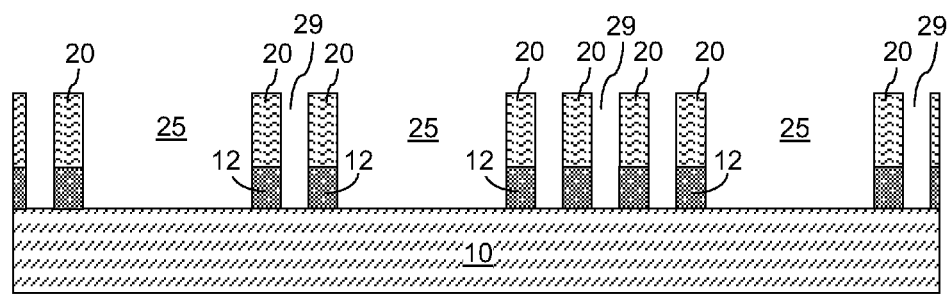
FIG. 10B is a vertical cross-sectional view of the first exemplary patterned structure along the vertical plane B-B' of FIG. 10A.

Referring to FIGS. 10A and 10B, the second pattern can be transferred into the underlying OPL 20L and the first material layer 12L. Remaining portions of the underlying OPL 20L constitute underlying OPL portions 20, and remaining portions of the first material layer 12L constitute first material portions 12. The underlying OPL portions 20 have the second pattern, and the first material portions 12 have the second pattern. The second material portions 22 may be removed during, or after, the transfer of the second pattern into the first material portions 12.

A narrow trench 29 can be formed within a cluster of stacks of a first material portion 12 and an underlying OPL portion 20. Each narrow trench 29 can have a uniform width, which is the same as the first uniform width. A wide trench 25 is formed in each area from which the patterned template layer 37 is removed. Each wide trench can separate clusters of stacks of a first material portion 12 and an underlying OPL portion 20.

In one embodiment, the first material portions 12 can be a permanent structure that is not subsequently removed from the first exemplary patterned structure. In this case, the underlying OPL portions 20 can be removed selective to the first material portion 12.

In another embodiment, the first material portion 12 can be a temporary structure that is removed after transfer of the second pattern into an upper portion of the substrate 10.

Figure 11A:
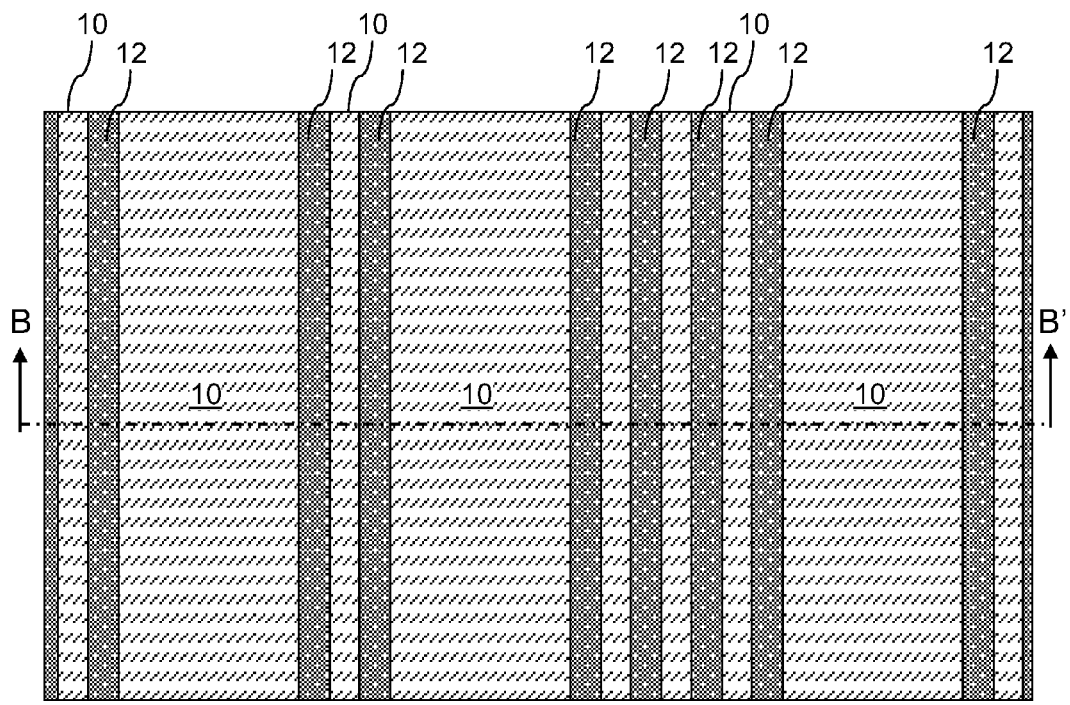
FIG. 11A is a top-down view of the first exemplary patterned structure after transfer of the second pattern into the substrate according to an embodiment of the present disclosure.
Figure 11B:
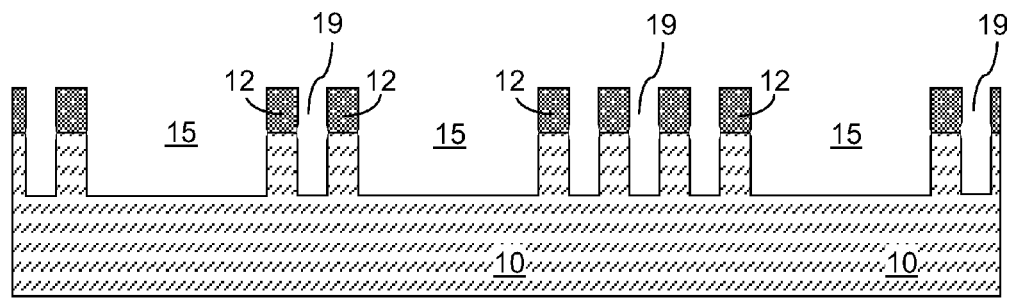
FIG. 11B is a vertical cross-sectional view of the first exemplary patterned structure along the vertical plane B-B' of FIG. 11A.

Referring to FIGS. 11A and 11B, the pattern in the first material portions 12 can be optionally transferred into an upper portion of the substrate 10 by another anisotropic etch. In this case, a narrow trench 19 can be formed within a region including a cluster of first material portions 12. Each narrow trench 19 can have a uniform width, which is the same as the first uniform width. A wide trench 15 is formed in each area from which the patterned template layer 37 is removed. Each wide trench can separate clusters of first material portions 12. The first material portion 12 may, or may not, be subsequently removed.

The second pattern of protruding structures is present within the first exemplary patterned structure. The protruding structures include the first material portions 12 and optionally upper portions of the substrate 10.

Figure 12A:
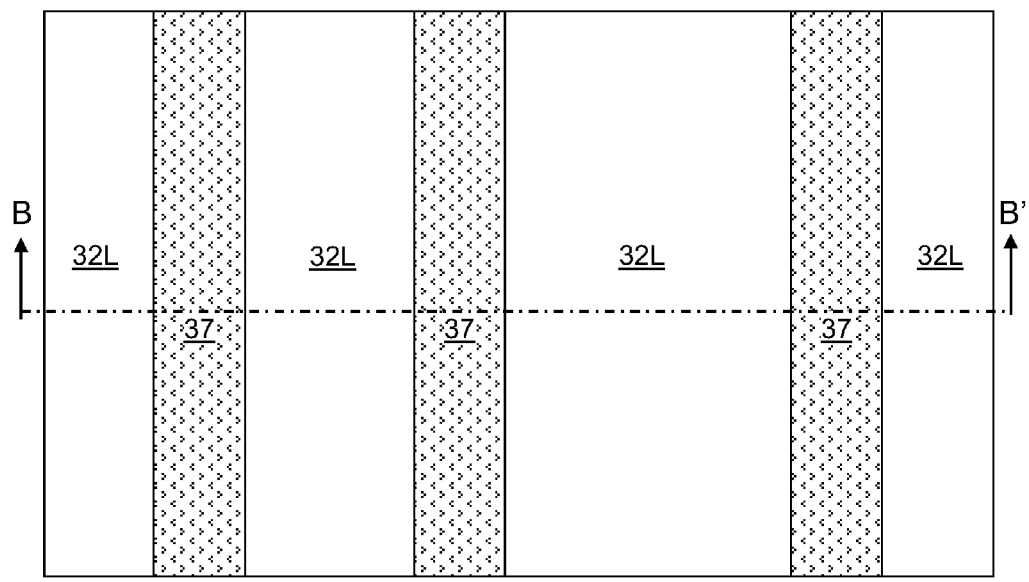
FIG. 12A is a top-down view of a second exemplary patterned structure after formation of an OPL layer and a patterned template layer according to an embodiment of the present disclosure.
Figure 12B:
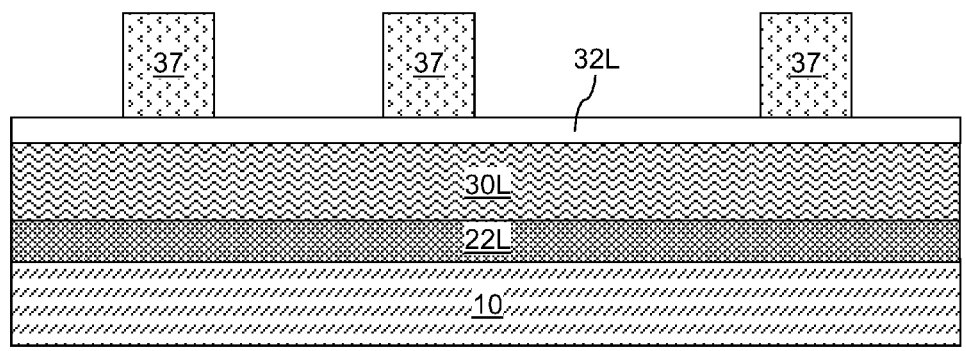
FIG. 12B is a vertical cross-sectional view of the second exemplary patterned structure along the vertical plane B-B' of FIG. 12A.

Referring to FIGS. 12A and 12B, a second exemplary patterned structure can be derived from the first exemplary patterned structure of FIGS. 1A-1C by omitting the first material layer 12L and the underlying OPL 20L.

Figure 13A:
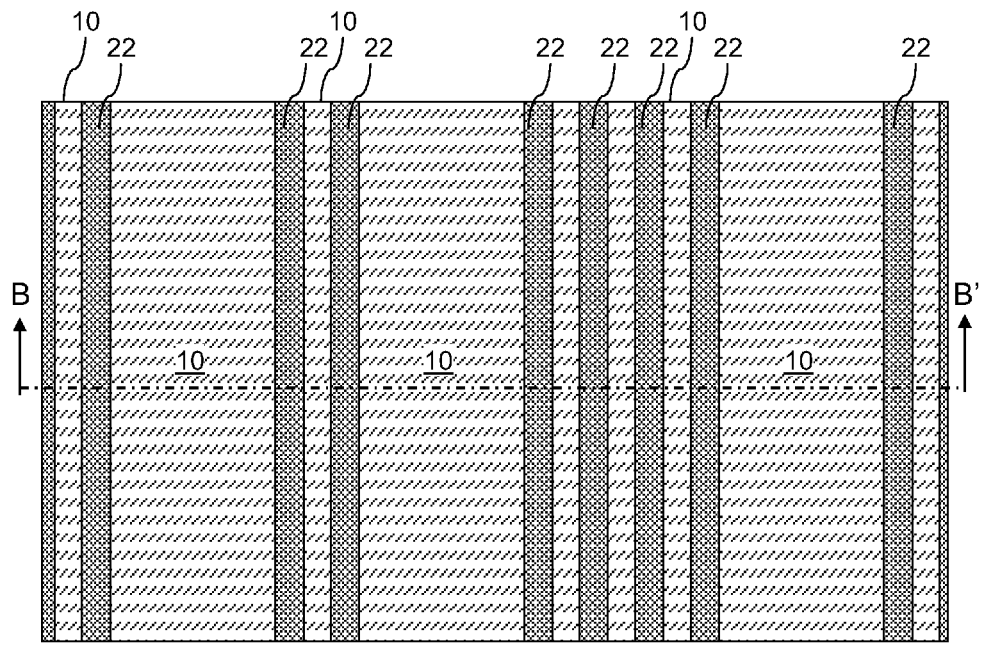
FIG. 13A is a top-down view of the second exemplary patterned structure after transfer of the second pattern into the substrate according to an embodiment of the present disclosure.
Figure 13B:
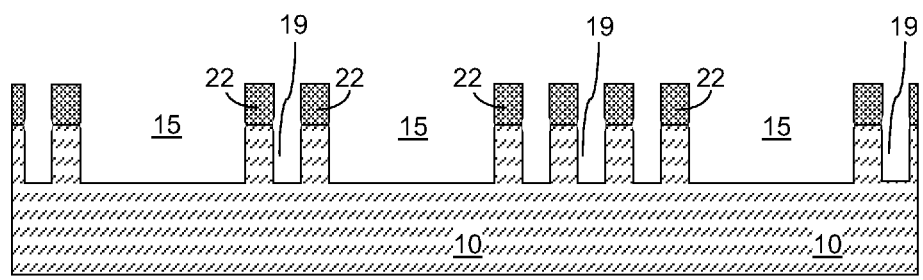
FIG. 13B is a vertical cross-sectional view of the second exemplary patterned structure along the vertical plane B-B' of FIG. 13A.

Referring to FIGS. 13A and 13B, the processing steps of FIGS. 2A, 2B, 3A-3C, 4A, 4B, 5A, 5B, 6A, 6B, 7A-7C, 8A, 8B, 9A, and 9B can be subsequently performed. The pattern in the second material portions 22 can then be transferred into an upper portion of the substrate 10 by an anisotropic etch.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method of forming a patterned structure comprising:
   forming an organic planarization layer (OPL) over a substrate;
   forming a self-aligned assembly of first polymer blocks comprising a first polymeric block component and second polymer blocks comprising a second polymeric block component on said OPL;
   forming a first pattern of protruding structures including said first polymer blocks by removing said second polymer blocks selective to said first polymer blocks;
   patterning said OPL employing at least said first polymer blocks as an etch mask, wherein trenches are formed within said patterned OPL;
   forming spin-on dielectric (SOD) portions by filling said trenches with an SOD material; and
   forming a second pattern of protruding structures including said SOD portions by removing said patterned OPL selective to said SOD portions.

2. The method of claim 1, wherein said second pattern is a complementary pattern of said first pattern.

3. The method of claim 1, further comprising forming a patterned template layer including at least one trench therein over said OPL, wherein said self-aligned assembly fills said at least one trench.

4. The method of claim 3, further comprising applying a copolymer material including said first polymeric block component and said second polymeric block component in said at least one trench, wherein said self-aligned assembly is formed by phase-separating said copolymer material.

5. The method of claim 4, wherein said patterned template layer comprises a patterned photoresist layer.

6. The method of claim 5, wherein said patterned photoresist layer is formed by:
   forming a blanket photoresist layer over said OPL; and
   lithographically exposing and developing said blanket photoresist layer to form said patterned photoresist layer.

7. The method of claim 4, wherein said patterned template layer comprises a material having a greater chemical affinity to said second polymeric block component than to said first polymeric block component.

8. The method of claim 7, wherein said copolymer material is applied until a topmost surface of said copolymer material is above a topmost surface of said patterned template layer.

9. The method of claim 8, wherein said forming of said self-aligned assembly comprises forming a horizontal stack of a first polymer block portion and a second polymer block portion over a portion of said patterned template layer.

10. The method of claim 3, wherein said at least one trench includes a rectangular trench having a lengthwise direction and a widthwise direction, wherein said rectangular trench extends over a greater distance along said lengthwise direction than along said widthwise direction.

11. The method of claim 10, wherein at least one of said first polymer blocks has a first uniform width and extends along said lengthwise direction, and at least one of said second polymer blocks has a second uniform width and extends along said lengthwise direction.

12. The method of claim 11, wherein said first uniform width is in a range from 3 nm to 25 nm, and said second uniform width is in a range from 3 nm to 25 nm.

13. The method of claim 11, wherein a sum of said first uniform width and said second uniform width is in a range from 6 nm to 50 nm.

14. The method of claim 3, wherein said first polymer blocks include:
first-type first polymer blocks having a first uniform width between a bottommost surface of said self-aligned assembly and a topmost surface of said self-aligned assembly; and
at least one second-type first polymer block including a horizontal portion overlying a portion of said patterned template layer and two vertical portions overlying of said OPL.

15. The method of claim 14, wherein each of said two vertical portions has said first uniform width between a bottommost surface of said self-aligned assembly and a height that is above a top surface of said portion of said patterned template layer and is below a topmost surface of said self-aligned assembly, and one of said two vertical portions is formed on one side of said portion of said patterned template layer and another of said two vertical portions is form on another side of said portion of said patterned template layer.

16. The method of claim 14, wherein said second polymer blocks include:
first-type second polymer blocks having a second uniform width between said bottommost surface of said self-aligned assembly and said topmost surface of said self-aligned assembly; and
at least one second-type second polymer block including a horizontal portion in contact with a top surface of said portion of said patterned template layer and two vertical portions contacting sidewalls of said portion of said patterned template layer.

17. The method of claim 16, wherein each of said two vertical portions has a width that is less than said second uniform width.

18. The method of claim 3, further comprising forming a buffer polymer layer over said OPL, wherein a top surface of said buffer polymer layer is physically exposed at a bottom of each of said at least one trench.

19. The method of claim 1, wherein said self-aligned assembly of said first polymer blocks and said second polymer blocks includes a region of a one-dimensional periodic array of at least two periodic repetitions of a set of a first polymer line portion and a second polymer line portion.

20. The method of claim 1, wherein said first polymeric block component is polystyrene and said second polymeric block component is poly(methyl methacrylate).

21. The method of claim 20, further comprising forming a patterned template layer including at least one trench therein over said OPL, wherein said self-aligned assembly fills said at least one trench.

22. The method of claim 21, wherein said patterned template layer comprises hydrogen silsesquioxane (HSQ) or methyl silsesquioxane (MSQ).

23. The method of claim 1, further comprising:
forming at least one material layer on said substrate, wherein said OPL is formed on said at least one material layer; and
transferring said second pattern into a material layer among said at least one material layer employing said SOD portions as an etch mask.

24. The method of claim 23, wherein said at least one material layer comprises a stack, from bottom to top, of a first material layer, an underlying OPL, and a second material layer.

25. The method of claim 1, wherein said OPL comprises amorphous carbon or a self-planarizing organic material including at least C, O, and H.

* * * * *